(12) United States Patent
Walstrum, Jr.

(10) Patent No.: US 7,671,624 B1
(45) Date of Patent: Mar. 2, 2010

(54) METHOD TO REDUCE CONFIGURATION SOLUTION USING MASKED-ROM

(75) Inventor: James A. Walstrum, Jr., San Jose, CA (US)

(73) Assignee: XILINX, Inc., San Jose, CA (US)

( * ) Notice: Subject to any disclaimer, the term of this patent is extended or adjusted under 35 U.S.C. 154(b) by 3 days.

(21) Appl. No.: 11/546,057

(22) Filed: Oct. 10, 2006

(51) Int. Cl.
  *G06F 7/38* (2006.01)
  *H03K 19/173* (2006.01)
  *H03K 19/177* (2006.01)

(52) U.S. Cl. ............... 326/38; 326/37; 326/39; 326/40; 326/41; 326/42; 326/43; 326/44; 326/45; 326/46; 326/47; 326/48; 326/49; 326/50

(58) Field of Classification Search ......... 326/37–50, 326/101–103
See application file for complete search history.

(56) References Cited

U.S. PATENT DOCUMENTS

| | | | |
|---|---|---|---|
| 5,550,839 A | 8/1996 | Buch et al. | |
| 5,640,107 A * | 6/1997 | Kruse | 326/38 |
| 6,337,579 B1 * | 1/2002 | Mochida | 326/41 |
| 7,298,646 B1 * | 11/2007 | Turner | 365/185.01 |
| 2005/0093573 A1 * | 5/2005 | Madurawe | 326/41 |

OTHER PUBLICATIONS

Xilinx, Inc., "HardWire™ Data Book" 1994, pp. 1-1 through 6-6, available from Xilinx, Inc., 2100 Logic Drive, San Jose, CA 95124.

* cited by examiner

*Primary Examiner*—Vibol Tan
*Assistant Examiner*—Matthew C Tabler
(74) *Attorney, Agent, or Firm*—William L. Paradice, III; Michael T. Wallace; Robert M. Brush

(57) ABSTRACT

A packaged PLD solution includes a first die having a masked-Read Only Memory (ROM) that is programmed during its fabrication to store configuration data, and includes a second die having a PLD including a number of configurable resources collectively configured to implement a circuit design embodied by the configuration data. The first die is electrically connected to the second die, and both the first die and second die are stacked and encapsulated together to form the packaged PLD solution. The configuration data is programmed into the masked-ROM by a manufacturer of both the masked-ROM and the PLD.

14 Claims, 4 Drawing Sheets

US 7,671,624 B1

METHOD TO REDUCE CONFIGURATION SOLUTION USING MASKED-ROM

FIELD OF THE INVENTION

The present invention relates generally to programmable logic devices and specifically to reducing the manufacturing costs of the programmable logic devices.

BACKGROUND

A programmable logic device (PLD) is a general-purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data. The configuration data is typically stored in an external non-volatile memory device such as a PROM or flash memory device and provided to the FPGA during well-known configuration operations.

An FPGA includes a plurality of generic resources (e.g., programmable logic blocks) that are configurable to implement various user designs, and many user designs may not utilize all the resources of the FPGA. As a result, an FPGA configured to implement a given function typically has a higher fabrication cost than an ASIC device that is specifically designed to perform the same function. Therefore, when sales of a system including an FPGA that is configured to implement a specified function reach a point where it becomes more economical to produce dedicated devices specifically tailored to perform the specified function, the FPGAs in the system may be replaced with a dedicated device that implements the same function and has the same pin-outs, timing characteristics, and performance metrics of the replaced FPGA.

For example, U.S. Pat. No. 5,550,839 entitled "Mask-Programmed Integrated Circuits Having Timing and Logic Compatibility to User-Configured Logic Arrays", which is incorporated herein by reference in its entirety and which is assigned to the assignee of the present invention, describes a dedicated device that is a pin, timing, and performance compatible replacement for an FPGA device. The dedicated device, which is commercially available as the Hardwire™ device from Xilinx, Inc. and is further described in the "Hardwire Data Book" published in 1994 by Xilinx, Inc., is a mask-programmable logic device that is capable of performing the same logical functions as a software programmable IC device such as an FPGA or PLD. More specifically, the mask programmable IC device includes many processing layers. The first several layers, which form individual device resources such as CLBs, IOBs, and the like, are common to both the FPGA devices and to the mask-programmable IC devices. The several top layers, which may include some metal layers, via layers, and contact layers, define the specific functions performed by a corresponding mask-programmed IC device, thereby "programming" the IC device to implement a user-specified function. Thus, a "programmed Hardwire device" is a Hardwire device that has been processed to add the programmable mask layers that define a specific design or function to be implemented.

Ideally, a Hardwire device can emulate the FPGA it replaces in all respects so that replacing the FPGA with the Hardwire device is transparent to the system and its users. A method used by Xilinx, Inc. to produce one type of Hardwire device includes virtually duplicating the architecture of the FPGA to be replaced, but replacing the software-programmable configuration memory cells with mask-programmable (e.g., hardwire) connections. Eliminating the configuration memory cells significantly reduces the required silicon area, and therefore also reduces manufacturing costs. Further, making the devices mask programmable allows much of the design and processing to be done only once for each FPGA product. Top-level processing layers specific to the user's design are then added to customize the behavior of the Hardwire device to match the functional behavior of the emulated FPGA as configured in the user's system.

Although effective in allowing FPGAs to be replaced by less-expensive Hardwire devices, the design process used to match the timing and performance characteristics of the Hardwire device with that of the emulated FPGA involves a relatively high development cost. Further, as the number of functional gates provided within FPGA devices increases, the cost savings realized by eliminating the configuration memory cells becomes less significant. Indeed, for current FPGA devices having millions of gates, the costs associated with designing the Hardwire device may exceed the cost savings realized by eliminating the configuration memory cells.

Thus, there is a need to reduce the manufacturing cost of FPGA devices.

SUMMARY

A method and apparatus are disclosed that provide an integrated PLD solution in a single semiconductor package that may be less expensive to manufacture than prior PLD solutions. In accordance with some embodiments of the present invention, a manufacturer fabricates a first die including a masked-Read Only Memory (ROM) that is hardened (e.g., programmed) during the fabrication process to store configuration data, and fabricates a second die including a programmable logic device (PLD) having a number of configurable resources collectively configurable to implement a specified circuit design embodied by the configuration data. The first die electrically connected to the second die, and then the first die and second die are stacked and encapsulated together to form a single semiconductor package.

For some embodiments, a PLD manufacturer provides a PLD and an associated user-programmable non-volatile memory to a customer. The customer programs configuration data into the non-volatile memory, and then configures the PLD to implement a circuit design embodied by the configuration data by loading the configuration data from the non-volatile memory into the PLD. The customer then verifies proper operation of the circuit design implemented by the PLD. Once the circuit design is verified, the customer sends the configuration data to the manufacturer. In response thereto, the manufacturer forms a masked-ROM on a first die, and during the fabrication process forces the masked-ROM's memory cells to specific logic states to program the configuration data provided by the customer into the masked-ROM. The manufacturer forms the PLD on a second die, stacks the first die and the second die, electrically connects the first die and second die to each other, and then encapsulates the first die and second die together in a single semiconductor package containing the hardened PLD solution.

For some embodiments, the masked-ROM does not include any write circuitry, and may utilize single-poly transistors as memory cells, which provides cost advantages over user-programmable non-volatile memory devices such as PROMs, EPROMs, EEPROMs, and flash memory devices that include write circuitry and that utilize double-poly transistors as memory cells. Further, configuration data stored in the masked-ROM is not externally accessible, which may provide better security for the configuration data, for example, as compared to user-programmable non-volatile memory devices that may be accessed via the memory device's write circuitry by an external controller.

BRIEF DESCRIPTION OF THE DRAWINGS

Like reference numerals refer to corresponding parts throughout the drawing figures.

DETAILED DESCRIPTION

Embodiments of the present invention are described below in the context of an exemplary FPGA architecture for simplicity only. It is to be understood that present embodiments are equally applicable to other PLD architectures such as complex PLDs, as well as to any circuit that requires associated data to be stored in a separate non-volatile memory device. In the following description, for purposes of explanation, specific nomenclature is set forth to provide a thorough understanding of the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Figure 1:
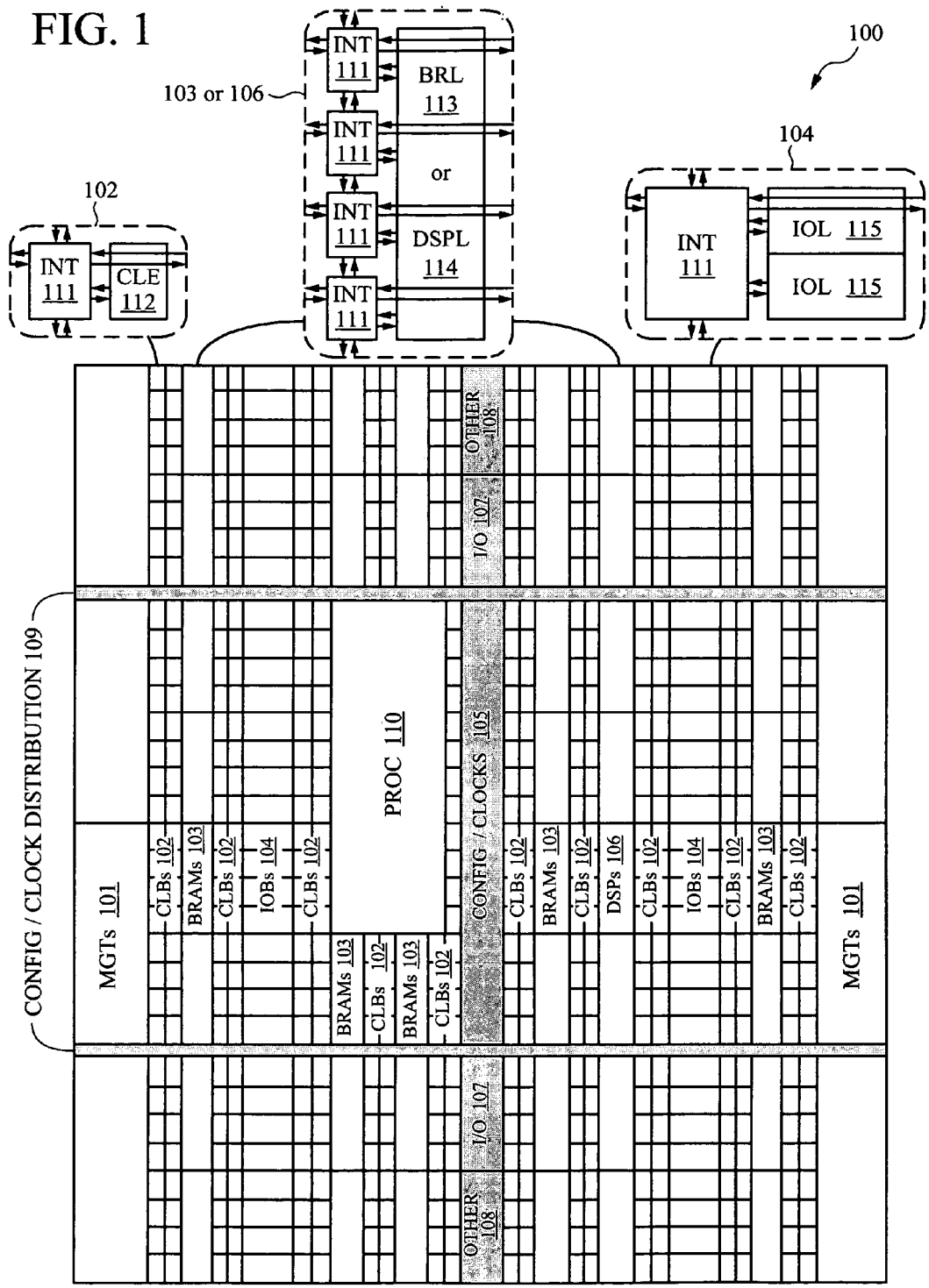
FIG. 1 is simplified block diagram of an FPGA architecture within which embodiments of the present invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
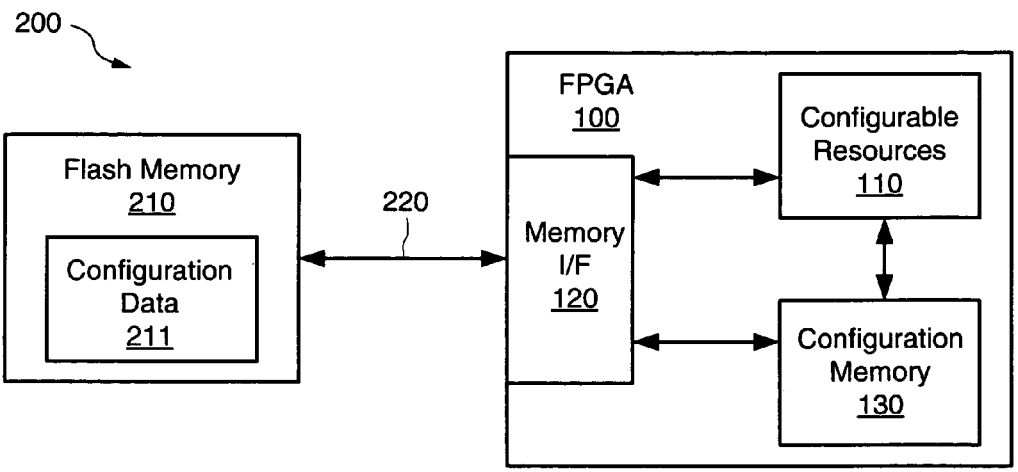
FIG. 2 is a block diagram of a conventional FPGA system including an FPGA coupled to an external non-volatile memory device.

Configuration data for FPGAs such as FPGA 100 is typically stored in an external (e.g., separate) non-volatile memory and loaded into the FPGA during well-known configuration operations. For example, FIG. 2 shows an exemplary FPGA system 200 including FPGA 100 of FIG. 1 coupled to an external flash memory device 210 via interconnect signal lines 220. FPGA 100 is shown in FIG. 2 to include configurable resources 110, a memory interface 120, and a configuration memory 130. Configurable resources 110 are representative of various programmable FPGA elements including, for example, CLBs 102, BRAMs 103, I/O 107, the programmable interconnect structure, and the like. Memory interface 120, which may be any well-known memory interface, facilitates communication between various components of FPGA device 100 and flash memory 210. For some embodiments, memory interface 120 utilizes well-known Serial Peripheral Interface (SPI) protocols currently employed by many flash memory devices, although other interface protocols may be used. Configuration memory 130 includes a plurality of configuration memory cells (not individually shown in FIG. 2 for simplicity) for storing configuration data that programs configurable resources 110 to implement a specified circuit design. The configuration memory cells may be any suitable type of memory cells. For some embodiments, the configuration memory cells may be SRAM cells. For other embodiments, the configuration memory cells may be DRAM cells.

Flash memory 210 is a user-programmable memory device that stores a configuration file including configuration data 211 that configures the FPGA's configurable resources 110 to desired states to implement a circuit design embodied by the configuration data. The configuration file stored by flash memory 210 may contain other data such as firmware code for the FPGA's embedded processor (not shown in FIG. 2 for simplicity). Further, although not shown for simplicity, flash memory 210 includes well-known write circuitry (e.g., write drivers, charge pumps, write control signals, and the like) that allows a customer to program flash memory 210 using well-known write operations. As known in the art, using flash memory 210 to store configuration data and other data such as firmware code for FPGA 100 allows the data stored in flash memory 210 to be updated in the field at any time, for example, using an external controller coupled to memory 210. In this manner, the configuration data stored in flash memory 210 may be dynamically changed in the field, for example, to cause FPGA 100 to implement a different and/or modified user design, and firmware code stored in flash memory 210 may be dynamically updated in the field, for example, to correct software glitches or bugs in the firmware code.

Further, although FIG. 2 shows FPGA 100 as being coupled to a flash memory device 210 that stores a configuration file for FPGA 100, for other embodiments, flash memory device 210 may be replaced by any suitable user-programmable non-volatile memory device (e.g., a PROM, EPROM, or EEPROM device). Thus, although described herein as being configured by flash memory device 210, for other embodiments, FPGA 100 may be configured by other suitable non-volatile memory devices.

Figure 3:
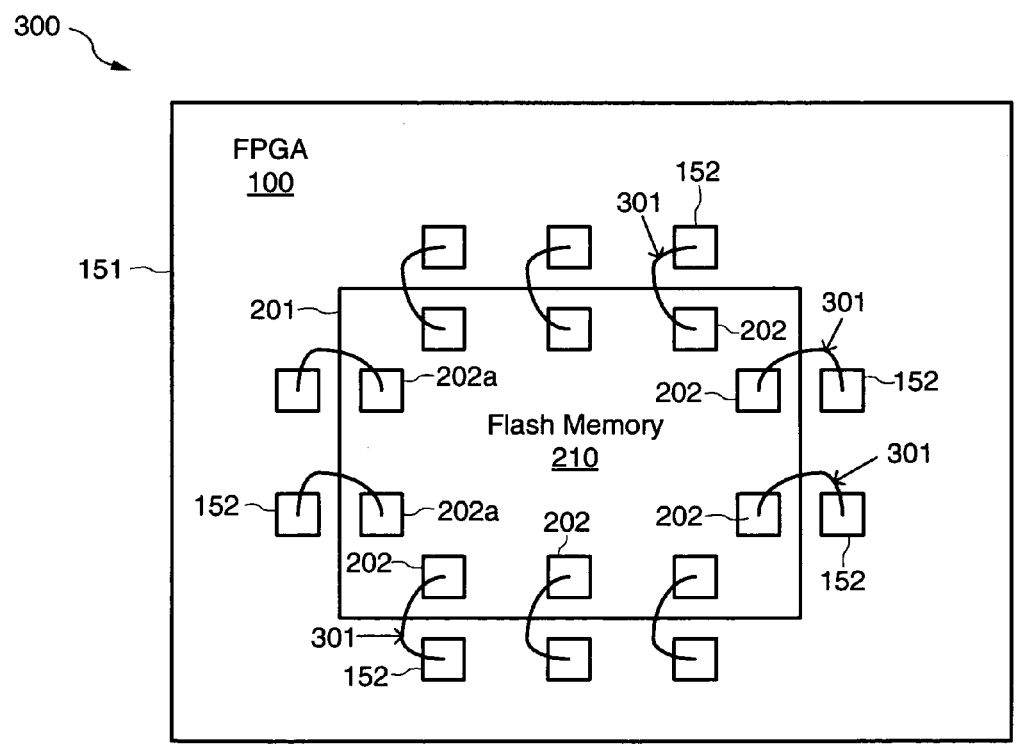
FIG. 3 is a top plan view of a conventional FPGA system including a non-volatile memory device stacked on top of an FPGA.

For some embodiments, FPGA 100 and flash memory device 210 may be separately packaged IC devices connected together via interconnect lines 220, for example, as depicted in FIG. 2. For other embodiments, flash memory 210 and FPGA 100 may be encapsulated in the same IC package. For example, FIG. 3 shows an FPGA package 300 containing flash memory 210 and FPGA 100. Using well-known techniques, FPGA 100 may be fabricated on a first semiconductor die 151 and electrically coupled to a plurality of conductive pads 152 on the first die 151, and flash memory 210 may be fabricated on a second semiconductor die 201 and electrically coupled to a plurality of conductive pads 202 on the second die 201. Some of the conductive pads 202a of flash memory 210 that facilitate the exchange of logic signals (e.g., data) between flash memory 210 and FPGA 100 are typically accessible by an external controller so that the external controller (not shown for simplicity) may load new configuration data and/or new firmware code into flash memory 210 while package 300 is subsequently employed in a user system. A semiconductor manufacturer such as the manufacturer of FPGA 100 may stack the second die 201 on top of the first die 151 (or stack the first die 151 on top of the second die 201), electrically couple conductive pads 202 of the second die 201 to corresponding conductive pads 152 of the first die 151 via wire bond connections 301, and encapsulate the first and second dice 151 and 201 together to form a single semiconductor package 300 in a well-known manner. For simplicity, only a few of pads 152, pads 202, and wire-bond connections 301 are labeled in FIG. 3. Note that while wire bond connections are shown, other techniques for inter-die communication between stacked die are known to those of ordinary skill in the art and may also be used.

Referring again to FIG. 2, the FPGA manufacturer typically sends an un-configured FPGA 100 and an un-programmed flash memory 210 to a customer. The customer creates a netlist of a desired circuit design to be implemented in FPGA 100, and then uses well-known software tools to convert the netlist into a configuration data file that will configure FPGA 100 to implement the desired circuit design. The customer then programs the configuration file into flash memory 210 using well-known techniques, and places FPGA 100 and flash memory 210 into a suitable user system. Then, upon power-up of FPGA 100, a well-known configuration operation is initiated that causes the configuration file stored flash memory 210 to be loaded into FPGA 100. More specifically, configuration data 211 stored in flash memory 210 is loaded into configuration memory 130 via memory interface 120 to program configurable resources 110 to implement the circuit design embodied by the configuration data. Further, any firmware code and/or other data contained in the configuration file and stored in flash memory 210 may be loaded into suitable configurable resources 110 (e.g., block RAM, embedded processors, and the like) via memory interface 120 during the configuration operation or during other modes of operation. Once configured, FPGA 100 implements the desired circuit design.

As mentioned above, it is desirable to reduce the cost of FPGA systems such as FPGA system 200. In accordance with the present invention, flash memory device 210 may be replaced by a well-known masked-ROM device that stores the configuration file for FPGA 100. As known in the art, a masked-ROM device is a one-time programmable memory device that is uniquely fabricated to store specified data using one or more semiconductor processing masks that are specifically tailored to embody the specified data, and that typically occupies less silicon area and typically is less expensive to manufacture on a per-unit basis than user-programmable non-volatile semiconductor memory devices such as PROMs, EPROMs, EEPROMs, and flash memory devices having similar storage capacities. For example, unlike user-programmable non-volatile semiconductor memory devices, masked-ROM devices do not include write circuitry (e.g., such as write drivers, charge pumps, write control circuitry, and the like) that allows the device to be programmed after fabrication, thereby reducing circuit area. Further, in contrast to the double-poly transistors (e.g., transistors having a floating gate and a control gate) typically utilized by PROM, EPROM, EEPROM, and flash memory devices to implement memory cells, masked-ROM devices typically utilize single-poly transistors to implement memory cells, which simplifies the fabrication process and further reduces costs.

The process of fabricating a masked-ROM device to store specified data is well-known, and therefore is not described in further detail herein for brevity. Because the fabrication of a masked-ROM device that stores specified data requires the production and use of one or more processing masks that are unique to the specified data, the per-unit cost of the masked-ROM device decreases as the number of such masked-ROM devices to be fabricated increases, and thus becomes less than the per-unit cost of a user-programmable non-volatile semiconductor memory device having a similar storage capacity only if some minimum number of such masked-ROM devices are fabricated. Accordingly, a customer may reduce the total cost of FPGA system 200 by employing embodiments of the present invention to replace flash memory 210 with a masked-ROM fabricated to store the same configuration file as flash memory 210 as long as the customer requires more than the minimum number of FPGA systems that results in the per-unit cost of the masked-ROM being less than the per-unit cost of memory device 210.

Figure 4:
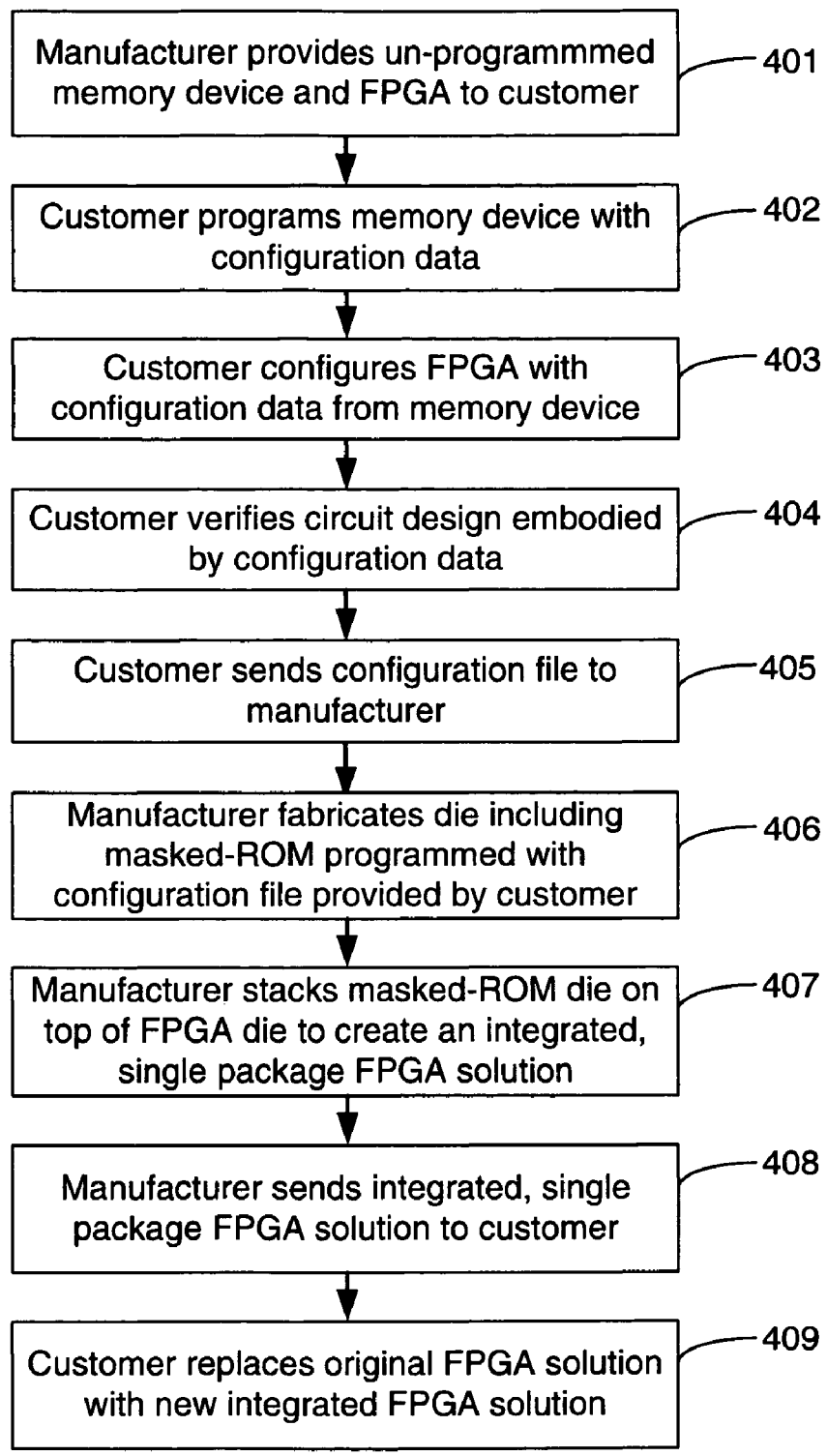
FIG. 4 is an illustrative flow chart depicting fabrication of an integrated FPGA solution in accordance with some embodiments of the present invention.
Figure 5:
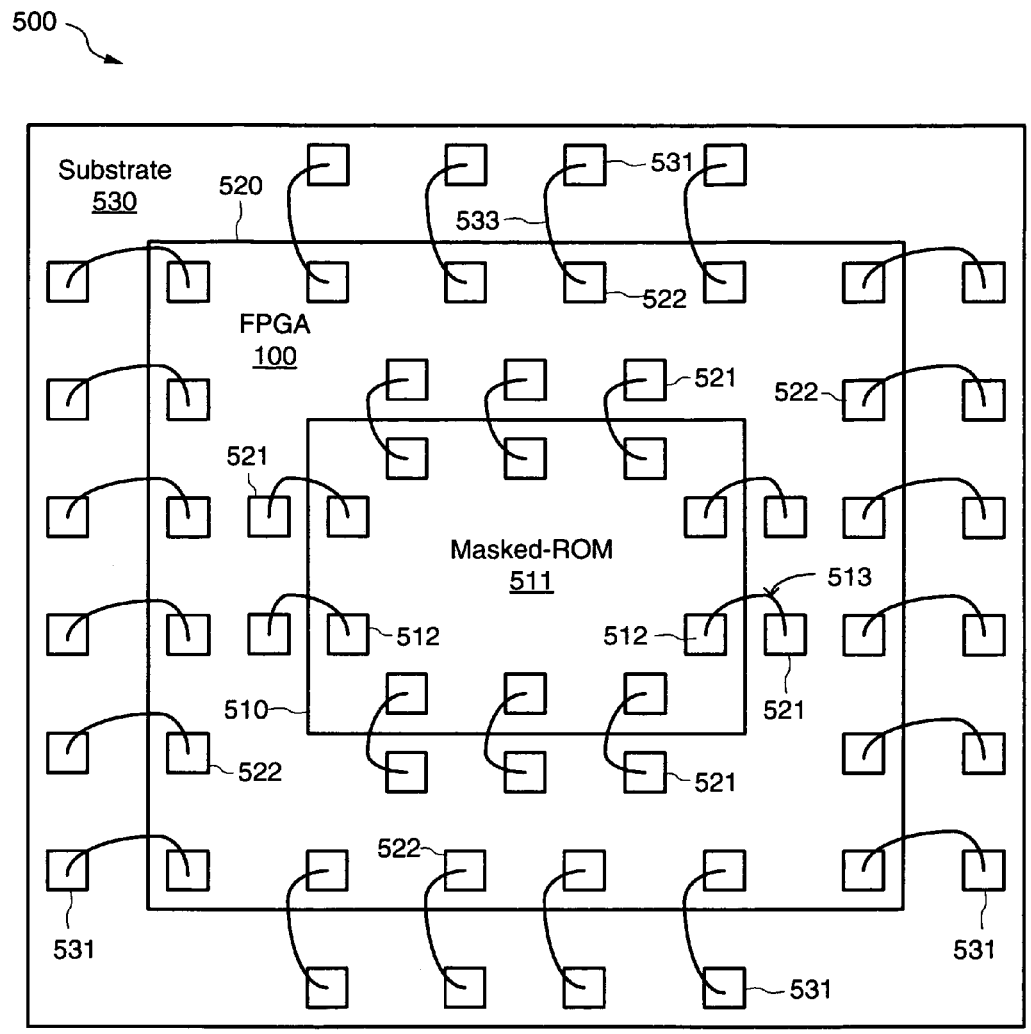
FIG. 5 is a top plan view of the integrated FPGA solution fabricated in accordance with the illustrative flow chart of FIG. 4.

An exemplary embodiment of the present invention is described below with respect to the illustrative flow chart of FIG. 4. Referring also to FIGS. 2, 3, and 5, an FPGA manufacturer sends FPGA 100 and flash memory 210 to a customer (step 401). Initially, FPGA 100 is not configured, and flash memory 210 is not programmed with any data (i.e., flash memory 210 is in an erased or blank state). For exemplary purposes of discussion herein, the manufacturer sends FPGA 100 and flash memory 210 to the customer as a single IC package 300, for example, as depicted in FIG. 3. However, for actual embodiments, the manufacturer may send FPGA 100 and flash memory 210 to the customer as separately packaged IC devices, for example.

The customer programs flash memory 210 with a configuration file in a well-known manner (step 402). As discussed above, the configuration file includes configuration data 211 that embodies a specific circuit design to be implemented in FPGA 100, and may also include other data such as firmware code for the FPGA's embedded processor. Then, the customer loads the configuration file from flash memory 210 into FPGA 100 using a well-known configuration operation to configure FPGA 100 to implement the circuit design embodied by the configuration data 211 contained in the configuration file (step 403). For some embodiments, the customer may deploy FPGA 100 and flash memory 210 in a user-system (not shown in the figures for simplicity) prior to configuring FPGA 100 with configuration data stored in flash memory 210. For other embodiments, the customer may configure FPGA 100 with configuration data stored in flash memory 210 prior to deploying FPGA 100 in a user system.

Once FPGA 100 is configured, the customer verifies that the circuit design implemented by FPGA 100 and embodied by the configuration data 211 operates properly (step 404). The customer may utilize any suitable techniques to verify that FPGA 100 properly implements the logic functions and/or exhibits the proper timing characteristics, power dissipation, and/or other properties of the circuit design embodied by the configuration data 211. After proper operation of the circuit design implemented by FPGA 100 is verified by the customer, the customer sends a copy of the configuration file that was programmed into flash memory 210 to the manufacturer (step 405). Then, the manufacturer fabricates on a first die a masked-ROM that is programmed to store configuration data 211 and any other data contained in the configuration file provided by the customer (step 406). The manufacturer may fabricate the masked-ROM using well-known techniques, for example, by creating suitable processing masks that embody data contained in the configuration file and then using the processing masks to harden the masked-ROM to store data contained in the configuration file.

In accordance with the present invention, the manufacturer then stacks the die containing the masked-ROM on top of a die containing FPGA 100 (or vice versa) to create an integrated, single-package FPGA solution (step 407). For example, referring to FIG. 5, the manufacturer fabricates a masked-ROM 511 on a first die 510, where the masked-ROM 511 is fabricated using well-known techniques to permanently store the configuration file provided by the customer. For some embodiments, the memory cells of the masked-ROM are single-poly transistors, where the logic state stored by each single-poly transistor in the masked-ROM is determined by whether the transistor's gate is coupled to a logic "1" voltage such as the supply voltage (VDD) or is coupled to a logic "0" voltage such as ground potential (GND). For example, during fabrication of the masked-ROM, a selected single-poly transistor may be configured to store a logic "1" for a corresponding bit of the configuration data by tying (e.g., hardwiring via the metal layer) the transistor's gate to VDD, and the selected single-poly transistor may be configured to store a logic "0" for the corresponding bit of the configuration data by tying (e.g., hardwiring via the metal layer) the transistor's gate to GND.

The manufacturer then fabricates FPGA 100 on a second die 520 in a well-known manner. As shown in the exemplary embodiment of FIG. 5, the first die 510 containing the masked-ROM 511 includes a plurality of first conductive pads 512 electrically coupled to corresponding I/O ports (not shown for simplicity) of masked-ROM 511, and the second die 520 containing FPGA 100 includes a plurality of second conductive pads 521 positioned around the periphery of masked-ROM 511 and electrically coupled to corresponding I/O ports (not shown for simplicity) of FPGA 100. The second die also includes a plurality of third conductive pads 522 positioned around the periphery of FPGA 100 and electrically coupled to corresponding I/O ports (not shown for simplicity) of FPGA 100.

The manufacturer stacks the first die 510 on top of the second die 520, and electrically connects the first conductive pads 512 of the first die 510 to corresponding second conductive pads 521 on the second die 520 via wire bond connections 513 (only one wire bond connection 513 labeled for simplicity). The electrical connections between conductive pads 512 on first die 510 and conductive pads 521 on second die 520 may facilitate the transfer of data stored in masked-ROM 511 to FPGA 100 (e.g., during configuration of FPGA 100), and may also provide power supply (VDD) and ground potential connections for masked-ROM 511. Further, although not shown in FIG. 5 for simplicity, FPGA 100 may include an SPI interface to receive data from masked-ROM 511 via any suitable number of conductive pads 521. For other embodiments, other techniques may be used to electrically connect masked-ROM 511 to FPGA 100. For one embodiment, dice 510 and 520 may be flip-chip connected together using well-known techniques.

Next, the manufacturer mounts stacked dice 510 and 520 onto a top surface of a substrate 530, which includes a plurality of fourth conductive pads 531 formed on the top surface thereof. The conductive pads 531 formed on substrate 530 are electrically connected to corresponding package leads (not shown for simplicity) provided on a bottom surface of substrate 530 via a well-known interconnect structure (not shown for simplicity) embedded in substrate 530, and are also electrically connected to corresponding second conductive pads 522 formed on FPGA 100 via wire bond connections 533 (only one wire bond connection 533 labeled in FIG. 5 for simplicity). Then, the manufacturer encapsulates dice 510 and 520 to substrate 530 using a layer of suitable protective material (not shown for simplicity), and then packages dice 510 and 520 and substrate 530 together to form an integrated, single-package, hardened FPGA solution 500. The electrical connections between conductive pads 522 on second die 520 and conductive pads 531 on substrate 530 may facilitate the exchange of logic signals between FPGA 100 and an external system coupled to package 500 via the substrate's package leads, and may also provide power supply (VDD) and ground potential connections for FPGA 100.

For other embodiments, other techniques may be used to electrically connect FPGA 100 to substrate 530. For example, for another embodiment, package 500 may include a well-known interposer layer (not shown in the figures for simplicity) that provides electrical connections between first die 510 and second die 520.

Thereafter, referring again to FIG. 4, the manufacturer delivers the integrated FPGA solution 500 to the customer (step 408), and the customer replaces the original FPGA solution (e.g., FPGA solution 200 or 300) with the new integrated FPGA solution 500 (step 409).

Replacing a conventional FPGA solution such as those depicted in FIGS. 2 and 3 with the hardened, single package FPGA solution 500 of FIG. 5 is advantageous for several reasons. First, because the masked-ROM device 511 does not include any write circuitry, the masked-ROM device 511 occupies less silicon area and may be less expensive to manufacture than prior user-programmable non-volatile memory devices such as PROM, EPROM, EEPROM, and flash memory devices that include write circuitry, thereby reducing the total cost of the FPGA solution over prior FPGA solutions. Less area and/or fewer devices may also mean less power is consumed.

Second, because the masked-ROM device 511 may utilize single-poly transistors as memory elements to store configuration data, as opposed to user-programmable non-volatile memory devices such as PROM, EPROM, EEPROM, and flash memory devices that utilize double-poly transistors (e.g., having a floating gate and a control gate) as memory cells to store configuration data, the masked-ROM device 511 requires less silicon area than a user-programmable non-volatile device (e.g., PROM, EPROM, EEPROM, and flash memory) requires to store the same amount of configuration data. In this manner, employing the masked-ROM 511 may reduce the total cost of the programmed FPGA package solution of FIG. 5.

Third, because the masked-ROM 511 is encapsulated with FPGA 100 to form a single semiconductor package 500, the conductive contacts 512 that provide signal connections between masked-ROM 511 of die 510 and FPGA 100 of die 520 are not directly accessible from outside the integrated package 500, for example, by tapping the package leads (not shown for simplicity) provided on the bottom surface of substrate 530. In this manner, the integrated FPGA package 500 of FIG. 5 provides improved security and integrity for data contained in masked-ROM 511, for example, as compared to prior FPGA solutions that employ user-programmable non-volatile memory devices that can be accessed in the field, for example, by an external controller coupled to the memory device. Even greater security may be afforded by other inter-chip connection techniques, such as stacked flip chips.

Fourth, because the data-hardened integrated FPGA solution 500 employs the same FPGA 100 as employed in prior FPGA solutions 200 and 300 of FIGS. 2 and 3, respectively, the logic functions, timing characteristics, and other performance metrics of a circuit design implemented by FPGA 100 of integrated FPGA solutions 500 of the present invention are the same as if the circuit design were implemented in FPGA 100 when disposed in either of prior solutions 200 or 300. In this manner, embodiments of the present invention allow for a hardened, single-package FPGA solution (e.g., FPGA solution 500) to provide cost savings without having to perform test vector analysis and/or alter the timing and performance characteristics of the FPGA. This is in contrast to the previous devices which typically require a high development cost to match the timing and performance characteristics of the development FPGA.

For the embodiments described above, new and/or additional data cannot be programmed into masked-ROM 511 after its fabrication. Therefore, for some embodiments, one or more of the conductive pads 522 provided on the second die 520 that contains FPGA 100 may be used to load new configuration data and/or other data (e.g., such as firmware code) into suitable configuration circuitry (not shown for simplicity) provided in FPGA 100 from a host controller (not shown for simplicity) via substrate 530's package leads, embedded interconnect circuitry, conductive pads 531, and wire bond connections 533. Thus, for some embodiments, FPGA 100 may include additional well-known circuitry (not shown for simplicity) that selectively places FPGA 100 of package 500 into either a first configuration mode that allows configuration data to be supplied to the FPGA via masked-ROM 511 or a second configuration mode that allows configuration data to be supplied to FPGA 100 of package 500 via an external controller or other memory coupled to the package leads (not shown for simplicity) of package 500.

Although the invention has been described in connection with several embodiments, it is understood that this invention is not limited to the embodiments disclosed, but is capable of various modifications, which would be apparent to a person skilled in the art. For example, although the described embodiments included four programmable logic blocks, it is understood that other numbers of blocks can be used in other embodiments. Thus, the invention is limited only by the following claims.

What is claimed is:

1. A packaged integrated circuit (IC) device, comprising:
a first die including a masked-Read Only Memory (ROM) that is programmed during fabrication of the masked-ROM to store configuration data provided by a user;
a second die including a programmable device having:
configuration circuitry for selectively invoking a first configuration mode and a second configuration mode, the configuration circuitry receiving the configuration data from the masked-ROM in the first configuration mode and receiving external configuration data from an external controller in the second configuration mode; and
a number of configurable resources collectively configured to implement a specified circuit design embodied by the configuration data or the external configuration data, wherein the first die is electrically connected to the second die, and wherein the first die and second die are stacked;
a plurality of first conductive pads provided on the first die and electrically connected to the masked-ROM; and
a plurality of second conductive pads provided on the second die and electrically connected to the programmable device, wherein corresponding pairs of the first and second conductive pads are electrically connected to one another, wherein the first conductive pads formed on the first die are not accessible from outside the packaged IC device.

2. The packaged IC device of claim 1, wherein the first die and second die are encapsulated together to form the packaged IC device.

3. The packaged IC device of claim 1, further comprising:
an interposer layer positioned between the first die and second die, wherein the interposer layer includes an interconnect structure that electrically connects the first conductive pads on the first die to the second conductive pads on the second die.

4. The packaged IC device of claim 1, wherein the configurable resources comprise configurable logic blocks of a field programmable gate array (FPGA).

5. The packaged IC device of claim 1, wherein the masked-ROM includes a plurality of memory cells, each memory cell consisting of one single-poly transistor.

6. The packaged IC device of claim 5, wherein the masked-ROM does not include any write circuitry.

7. The packaged IC device of claim 1, wherein the configuration data is programmed into the masked-ROM by a manufacturer of the programmable device.

8. A semiconductor package, comprising:
a first semiconductor die including a memory having a memory state that is one-time programmable and set during fabrication of the first semiconductor die;
a second semiconductor die coupled to the first semiconductor die, the second semiconductor die including a programmable device having a number of configurable resources configured to implement a specified circuit design, wherein the second semiconductor die is adapted to be configured by the memory state of the first semiconductor die during a first configuration mode and the second semiconductor die is adapted to be configured with a configuration bit stream received from a host controller during a second configuration mode;
a plurality of first conductive pads provided on the first semiconductor die and electrically connected to the memory; and
a plurality of second conductive pads provided on the second semiconductor die and electrically connected to the programmable device, wherein corresponding pairs of the first and second conductive pads are electrically connected to one another, wherein the first conductive pads formed on the first die are not accessible from outside the semiconductor package.

9. The semiconductor package of claim 8, wherein the first semiconductor die comprises a masked read only memory.

10. The semiconductor package of claim 9, wherein the second semiconductor die comprises a programmable logic device.

11. The semiconductor package of claim 10, wherein the programmable logic device comprises a field programmable gate array.

12. The semiconductor package of claim 8, further comprising package leads coupled to the second semiconductor die.

13. The semiconductor package of claim 12, wherein the host controller is external to the semiconductor package and is coupled to the package leads, the package leads being adapted to provide the configuration bit stream to the second semiconductor die during the second configuration mode.

14. The semiconductor package of claim 13, wherein the host controller comprises a memory device.

* * * * *